United States Patent [19]
Gurtler et al.

[11] Patent Number: 5,424,245
[45] Date of Patent: Jun. 13, 1995

[54] METHOD OF FORMING VIAS THROUGH TWO-SIDED SUBSTRATE

[75] Inventors: Richard W. Gurtler, Mesa; Jeffrey Pearse, Chandler; Syd R. Wilson, Phoenix, all of Ariz.

[73] Assignee: Motorola, Inc., Schaumburg, Ill.

[21] Appl. No.: 177,350

[22] Filed: Jan. 4, 1994

[51] Int. Cl.⁶ .................... H01L 21/60; H01L 21/44
[52] U.S. Cl. .................... 437/183; 257/774; 437/209
[58] Field of Search ............. 257/774, 777; 437/209, 437/183

[56] References Cited

U.S. PATENT DOCUMENTS

| | | | |
|---|---|---|---|
| 3,648,131 | 3/1972 | Stuby . | |
| 4,754,316 | 6/1988 | Reid | 257/777 |
| 4,761,681 | 8/1988 | Reid | 257/777 |
| 4,807,021 | 2/1989 | Okumura | 257/777 |
| 4,954,875 | 9/1990 | Clements | 257/774 |
| 5,037,782 | 8/1991 | Nakamura et al. . | |
| 5,059,553 | 10/1991 | Berndlmaier et al. | 437/183 |
| 5,139,969 | 8/1992 | Mori | 437/183 |
| 5,229,647 | 7/1993 | Gnadinger | 257/774 |
| 5,366,589 | 11/1994 | Chang | 437/183 |

FOREIGN PATENT DOCUMENTS 02-239627 9/1990 Japan .
04-356956 12/1992 Japan .

OTHER PUBLICATIONS

IBM Technical Disclosure Bulletin vol. 34, #11, Apr. 1992.
IBM Technical Discl. Bull., S. Magdo, vol. 19, #4, Sep. 1976.

Primary Examiner—Brian E. Hearn
Assistant Examiner—Leon Radomsky
Attorney, Agent, or Firm—Robert D. Atkins

[57] ABSTRACT

An integrated circuit substrate (26) is formed with active circuit elements (24, 32) on first and second surfaces of the substrate. The active circuit elements are interconnected with though-substrate vias (28) to minimize signal routing and reduce propagation delay. The through-substrate vias may be formed with a plurality of holes (52) through the IC substrate. A dielectric layer (54) is deposited on the surface of the IC substrate and through the holes. A conductive layer (56) is deposited through the holes to form the through-substrate vias. The dielectric layer is removed from the surface of the IC substrate to leave the through-substrate vias isolated from the IC substrate by the dielectric layer. A second substrate (26) is formed as described and the two substrates are joined as a two-sided chip (21) with active circuit elements on both sides interconnected by through-substrate vias.

5 Claims, 7 Drawing Sheets

METHOD OF FORMING VIAS THROUGH TWO-SIDED SUBSTRATE

CROSS REFERENCE TO RELATED PATENT APPLICATIONS

The present application is related to U.S. patent application 08/177,028, Attorney's Docket SC08544P, entitled "CIRCUIT AND METHOD OF INTERCONNECTING SUBSTRATES", filed Jan. 4, 1994, by Richard Gurtler et al and assigned to the same assignee, Motorola, Inc.

The present application is further related to U.S. patent application 08/177,024, Attorney's Docket SC08545P, entitled "CIRCUIT AND METHOD OF SHAPING INTER-SUBSTRATE PLUG AND RECEPTACLE INTERCONNECTS", filed Jan. 4, 1994, by Richard Gurtler and assigned to the same assignee, Motorola, Inc.

BACKGROUND OF THE INVENTION

The present invention relates in general to semiconductor interconnects and, more particularly, to stacked interconnecting substrates with minimal interconnect lengths.

Integrated circuits (IC) typically use multiple layers of metal within the chip to perform interconnections between active elements. The metal interconnects route signals around the chip as necessary to achieve the intended function. As integrated circuits become smaller and more dense, the lines interconnecting active elements become narrower and more closely packed together. Therefore, the resistance of each interconnect line increases as cross-sectional area decreases. Likewise, the capacitance between adjacent interconnect lines increases with less spacing between the lines. The interconnect lines should be kept as short as possible to reduce propagation delay. Thus, increasing density can spawn slower operating speeds because of the interconnect requirements. Another problem occurs during electromigration where high temperatures and high current density create voids in the metal and eventually open-circuits the interconnect lines.

Prior art solutions have considered low dielectric insulators and higher conductivity metals for higher density ICs. Nonetheless, VLSI designs continue to struggle with speed vs. density trade-offs. With each additional metal layer to handle the large number of functional active circuit elements, more masking steps are necessary which adds expense and complexity to the IC.

In many applications such as supercomputers, the need to pack many functions into dense packages while maintaining high operating speed has lead designers to consider using two-sided substrates with semiconductor devices on both sides of the integrated circuit wafer to make maximum use of available space and achieve the necessary functionality. The two-sided substrate tends to increase channel routing length in order to interconnect circuits on opposite sides of the substrate. Yet, the aforedescribed physical electrical behavior of the routing channels favor using very short connections to reduce propagation delay and maintain high operating speed.

Hence, a need exists to minimize signal routing and propagation delay between two surfaces of a substrate.

DETAILED DESCRIPTION OF THE PREFERRED EMBODIMENT

Generally, the present invention relates to the fabrication and interconnection of integrated circuit (IC) chips in such a manner as to provide very high performance inter-chip and intra-chip communication and very high system packing densities. The method includes fabricating IC composite substrates having high performance circuit elements on opposite surfaces of the substrate. The circuit elements are electrically connected together with through-substrate vias passing through the interior of the substrate. In addition, each surface is provided with inter-substrate interconnects that allow very high density coupling to other substrates. In this manner, very complex assemblies may be constructed.

Figure 1:
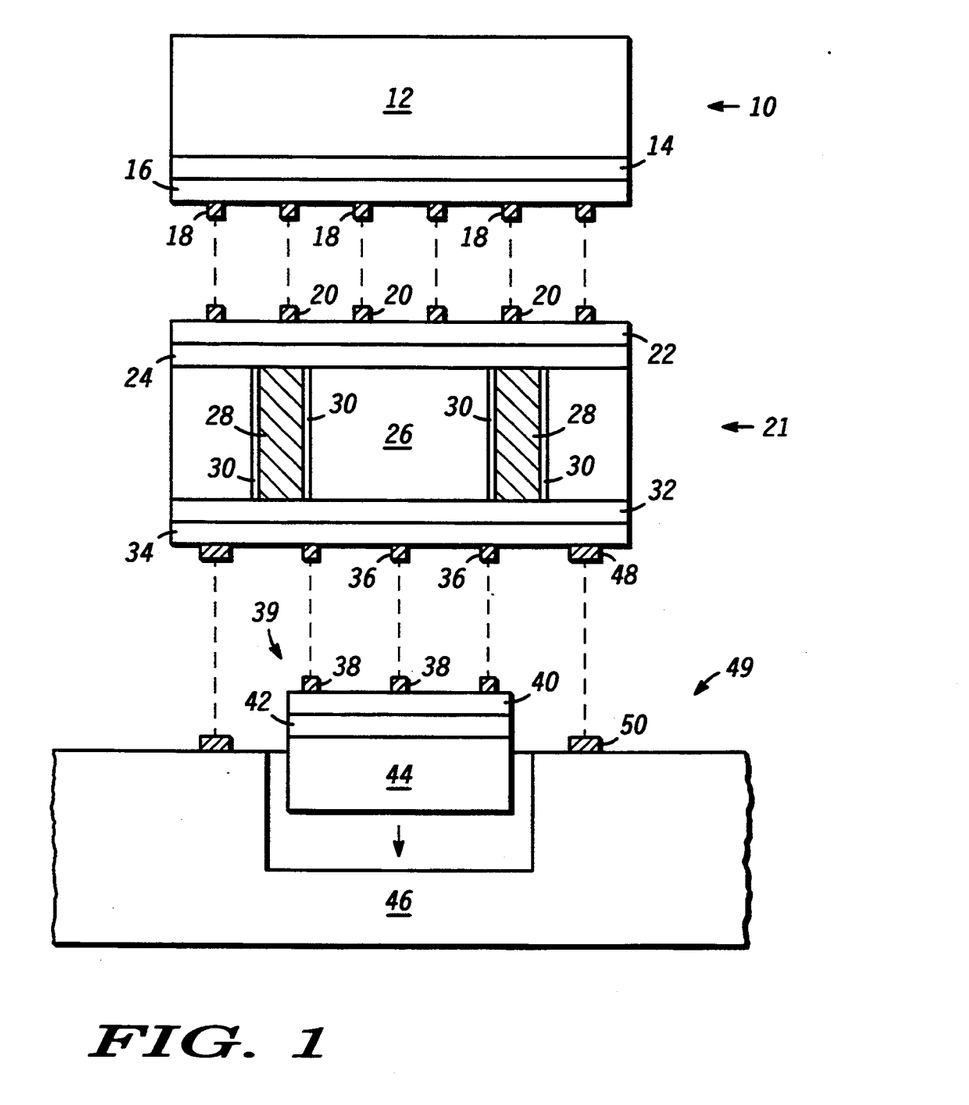
FIG. 1 illustrates a high density multi-chip system.

Referring to FIG. 1, a complete system is illustrated showing an embodiment of the present invention. Single-sided chip 10 comprises a semiconductor substrate 12 with IC device layer 14, interconnect layer 16 and inter-chip interconnects 18 constructed on one surface. IC device layer 14 and interconnect layer 16 are symbolic representations of highly complex circuit structures typically found in the IC industry. IC device layer 14 includes active and passive circuit elements fabricated through a series of processing steps such as ion implantation, oxidation, wet and dry etching, physical and chemical deposition and lithographic patterning. Interconnect layer 16 refers to layers of conductors and dielectrics that serve the purpose of providing electrical connections between the IC active and passive devices to create functional circuit elements. Inter-chip interconnects 18 are structural elements fabricated on interconnect layer 16 for providing electrical connections between predetermined nodes in interconnect layer 16 and IC device layer 14 and like-purpose interconnects on a first surface of IC chip 21.

The two-sided composite chip 21 comprises semiconductor substrate 26 having IC device layer 24, interconnect layer 22 and inter-chip interconnects 20 on the first surface of semiconductor substrate 26. IC device layer 24 includes active and passive circuit elements fabricated through conventional IC processing steps. Interconnect layer 22 refers to layers of conductors and dielectrics that provide electrical connections between the IC active and passive devices. Inter-chip interconnects 20 fabricated on interconnect layer 22 provides electrical connections between predetermined nodes in interconnect layer 22 and IC device layer 24 and inter-chip interconnects 18.

Two-sided composite chip 21 further comprises IC device layer 32, interconnect layer 34 and inter-chip interconnects 36 on a second, oppositely-oriented surface of semiconductor substrate 26. IC device layer 32 includes active and passive circuit elements fabricated through conventional IC processing steps. Interconnect layer 34 refers to layers of conductors and dielectrics that provide electrical connections between the IC active and passive devices. Inter-chip interconnects 36 and 48 fabricated on interconnect layer 34 provides electrical connections between predetermined nodes in interconnect layer 34 and IC device layer 22 and like-purpose interconnects on the surface of CI chip 39 and multi-chip module substrate 49, respectively.

As a key feature of the present invention, two-sided composite chip 21 includes through-substrate conducting vias 28 for providing electrical connectivity between predetermined circuit nodes in IC device layer 24 and/or interconnect layer 22 and circuit nodes in IC device layer 32 and/or interconnect layer 34. Isolation layer 30 provides electrical isolation between through-substrate conducting vias 28 and semiconductor substrate 26. The through-substrate vias minimize the routing channel length and therefore reduce propagation delay and increase operating speed for substrates having circuit elements on both surfaces.

A single-sided chip 39 comprises a semiconductor substrate 44, IC device layer 42, interconnect layer 40 and inter-chip interconnects 38. IC device layer 42 includes active and passive circuit elements fabricated through conventional IC processing steps. Interconnect layer 40 refers to layers of conductors and dielectrics that provide electrical connections between the IC active and passive devices. Inter-chip interconnects 38 fabricated on interconnect layer 40 provides electrical connections between predetermined nodes in interconnect layer 40 and IC device layer 42 and like-purpose inter-chip interconnects 36.

Two-sided chip 21 provides interconnects 48 to electrically interconnect the chip system, comprising single-sided chips 10 and 39 and two-sided composite chip 21, to a higher level system such as multi-chip module substrate 49. Multi-chip module substrate 49 is shown to include a recessed area for housing single-sided chip 39 and thereby minimize lead lengths for mating interconnects 48–50 which allow power and I/O signals to transfer between the chip system and the higher level multi-chip module system.

In the following disclosure, several methods are described to achieve the present invention. In order to be specific, it will be assumed that the semiconductor substrate is silicon, but it should be clear to those skilled in the art that in many respects, analogous techniques can be applied to other semiconductor substrates, e.g. GaAs.

Figure 2:
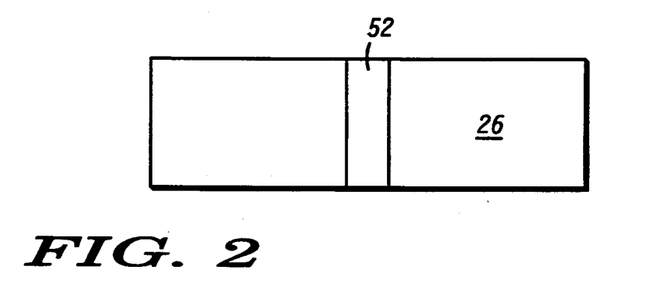
FIGS. 2-7 illustrate processing steps to form the through-substrate vias of FIG. 1.

FIGS. 2–7 illustrate one method of fabricating the two-sided composite chip 21 with through-substrate vias 28 shown in FIG. 1. In FIG. 2, a predetermined number of hollow regions 52 are formed in predetermined locations completely through semiconductor substrate 26. The regions, which will ultimately contain through-substrate vias 28 and via isolation layer 30, may be fabricated by a number of methods and variety of sizes. The size of region 52 depends on the number of through-substrate vias 28 required, the method used for constructing region 52, the method and material used for filling region 52, the thickness of substrate 26, and the necessary electrical resistance of vias 28. As an illustration, if semiconductor substrate 26 is silicon and has a thickness of say 200 microns, with a nominal hole diameter of 10 microns and is filled with heavily doped polysilicon, the via resistance is on the order of 50 ohms. This is adequate for low-current signal propagation. To achieve lower resistance vias, the substrate used may be thinner, the diameters may be larger, and more conductive via materials may be considered.

One method to form region 52 is by reactive ion etching (RIE). In this method, standard lithographic techniques (not shown in FIG. 2) are used to define the regions, say through masking and patterning both sides of substrate 26, using infrared alignment techniques to ensure registration of the patterns on both sides. Relatively large dimension holes are considered here. Both sides are exposed to an anisotropic RIE silicon etch until the regions are completed through substrate 26. As an example, RIE halogen etch chemistries such as $SiF_4 + Cl_2 + HBr + He + O_2$ provide efficient, anisotropic silicon etches capable of high aspect ratio etching.

Other methods may also be considered including laser drilling and photo-assisted etching. In particular, recently published papers have described highly controlled anodic "macropore" etching capable of producing precisely located, very uniform holes through 200 microns of silicon with diameters of only a few microns ("The Physics of Macropore Formation in Low-Doped n-Type Silicon", V. Lehman, J. Electrochem. Soc. Vol. 140, No. 10, October 1993). Such techniques are expected to work for GaAs and other systems as well.

Figure 3:
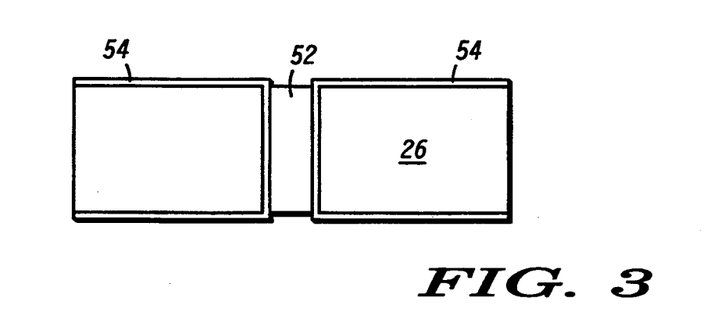

In FIG. 3, a dielectric layer 54 is conformally grown or deposited on the surface of substrate 26 and the inner surfaces of region 52 that have been formed in substrate 26. One method is to use thermal oxidation of the silicon in a wet oxidizing ambient. Low pressure CVD may also be used to deposit a conformal layer of oxide for dielectric layer 54. An oxide layer of perhaps 0.5 to 1 micron would be sufficient for substantial voltage standoff and capacitance reduction purposes.

Figure 4:
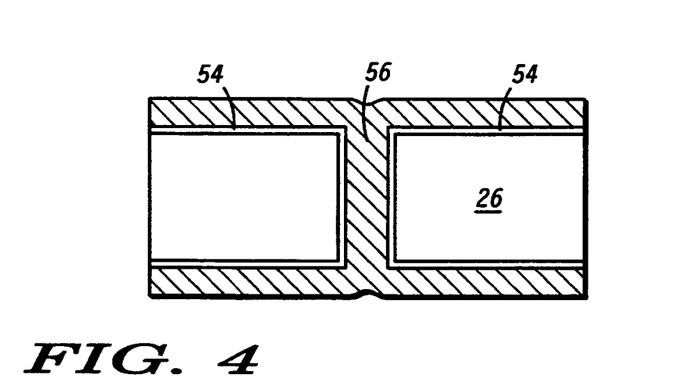

Turning to FIG. 4, a conductive material 56 is conformally deposited on substrate 26 to fill region 52. In this first method, it is desirable that conducting material 56 be compatible with subsequent high temperature processing steps, consequently a refractory material is required. Heavily-doped polysilicon is a very good choice since it introduces minimal stress and can be processed at very high temperatures. Other materials that can be considered are polycides (polysilicon and metals forming silicides, e.g. Ti Si, WSi), and refractory metals such as tungsten (W). In practice, region 52 may not fill perfectly and may contain voids. This can be minimized by tuning the process, but in any event would not be a serious problem as long as connectivity is maintained.

Figure 5:
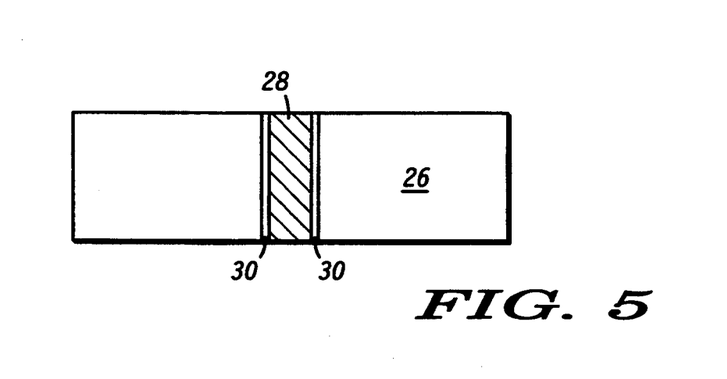

In FIG. 5, chemical mechanical polishing is used to remove excess conductive material 56 and dielectric layer 54 from top and bottom surfaces of substrate 26. The result yields with through-substrate via 28 and isolation layer 30 through substrate 26. Other planarization techniques may also be used, e.g. resist etchback, to remove excess conductive material 56 and dielectric layer 54 from top and bottom surfaces of substrate 26.

Figure 6:
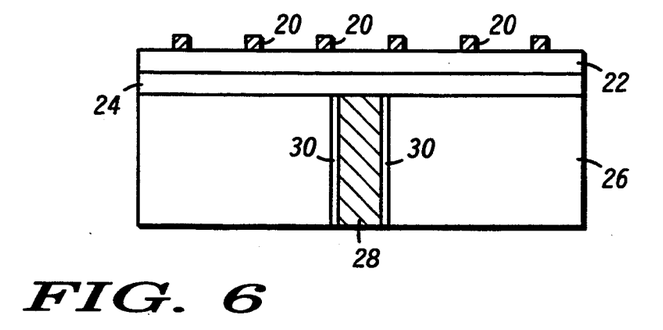

Referring to FIG. 6, substrate 26 is processed in a conventional manner to provide active and passive IC device layer 24 and interconnect layer 22. A circuit node within IC device layer 24 or interconnect layer 22 is electrically coupled to through-substrate via 28. Other circuit nodes within IC device layer 24 and/or interconnect layer 22 are coupled to other though-substrate vias like 28. The fact that through-substrate via 28 and isolation layer 30 are compatible with high temperature processing would require minimal adjustment of conventional processes, although layout of structures would clearly require allowance for through-substrate via 28 and isolation layer 30.

The inter-chip interconnects 20 are also fabricated as shown in FIG. 6. Inter-chip interconnects 20 allow two chips to be interconnected in a high resolution (small size, pitch and height) manner. A large number of inter-chip interconnects 20 are typically used. One method is through the use of "bump" technology which is currently used in "Chip On Board" and multi-chip module assemblies. In the present embodiment, bumps with diameters and heights in the micron range are contemplated, such as discussed in U.S. patent application 08/177,028, entitled "CIRCUIT AND METHOD OF INTERCONNECTING SUBSTRATES" and U.S. patent application 08/177,028, entitled "CIRCUIT AND METHOD OF SHAPING INTER-SUBSTRATE PLUG AND RECEPTACLE INTERCONNECTS" noted above.

Figure 7:
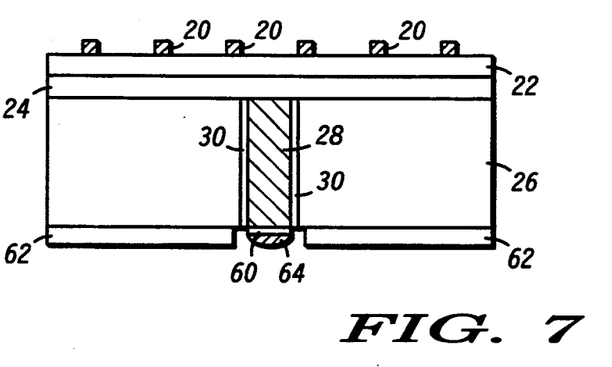

In FIG. 7, dielectric layer 62 is deposited on the bottom surface of substrate 26 and patterned to provide access to through-substrate via 28. Bump 64 is fabricated with an adhesion/barrier layer 60 between bump 64 and through-substrate via 28. In practice, dielectric layer 62 may be polyimide, while bump 64 is an Pb/Sn alloy, and barrier/adhesion layer 60 is Ti—W—Cu. Bump 64 joins with like bump 64 in second substrate 26 to form a complete two-side chip 21, see FIG. 8. Alternately, bump 64 provides interconnection to external systems such as multi-chip module 49 and therefore may be of more conventional size and configuration.

Figure 8:
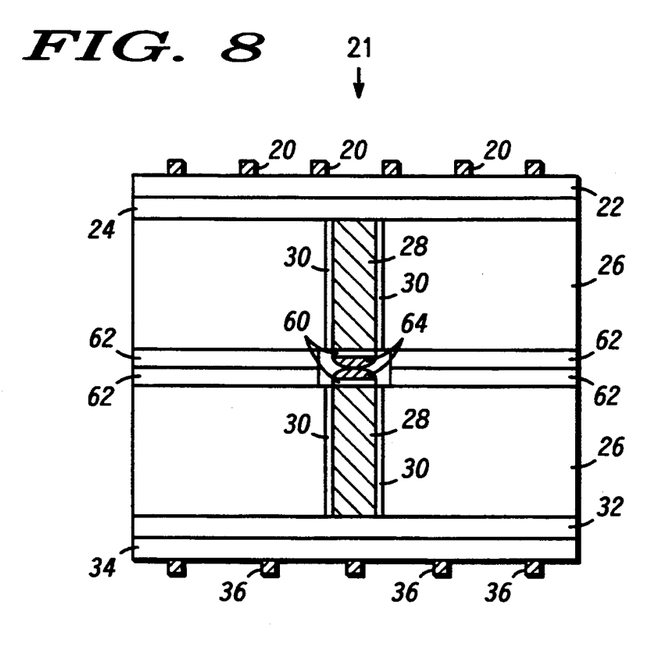
FIG. 8 illustrates merging first and second substrates into the two-sided chip of FIG. 1.

A second substrate like 26 is fabricated as described in FIGS. 2-7. In FIG. 8, the first substrate like 26 is joined with the second substrate like 26 to form the two-sided composite chip 21 of FIG. 1. The joining is accomplished through reflow of bumps 64 while the two substrates are placed in contact with one another. Note that dielectric layer 62 performs several functions: it determines how close the two bump systems can approach each other; it provides a "dam" to confine the solder bumps during reflow; and it can provide some additional adhesion and stress relief between the two surfaces.

During the processes of FIGS. 7 and 8, the front surfaces might have to be protected. The protection could be accomplished with a polyimide or photoresist layer (not shown) that could be subsequently removed prior to assembly.

Thus, FIG. 8 illustrates a key feature of the present invention as through-substrate via 28 electrically connects circuit nodes in IC device layer 24 and/or interconnect layer 22 with circuit nodes of IC device layer 32 and/or interconnect layer 34. The minimal signal path length through via 28 and bumps 64 reduces propagation delay between the two surfaces of substrates 26 and allows high density, high speed chips to be fabricated with active and passive circuit elements on both sides of the substrate.

In the process sequence of FIGS. 2-8, through-substrate vias 28 and the isolation layer 30 must be compatible with high temperature processing. An alternative process sequence, shown in FIGS. 9-13 removes the high temperature compatibility requirement.

Figure 9:
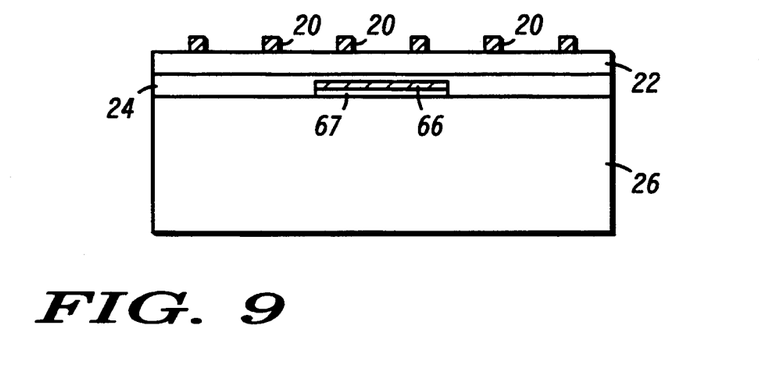
FIGS. 9-13 illustrate a second sequence of processing steps to form the through-substrate vias of FIG. 1.

In FIG. 9, substrate 26 is processed to form IC device layer 24, interconnect layer 22, and inter-chip interconnects 20 as described above. Also formed within IC device layer 24 is metal pad 66 and dielectric pad 67 which are located at a circuit node connection location for through-substrate via 28. Metal pad 66 and dielectric pad 67 may also be located in interconnect layer 22. Metal pad 66 represents a conductor that is electrically coupled to conductors in IC device layer 24. Dielectric pad 67 serves to isolate metal pad 66 from substrate 26.

Figure 10:
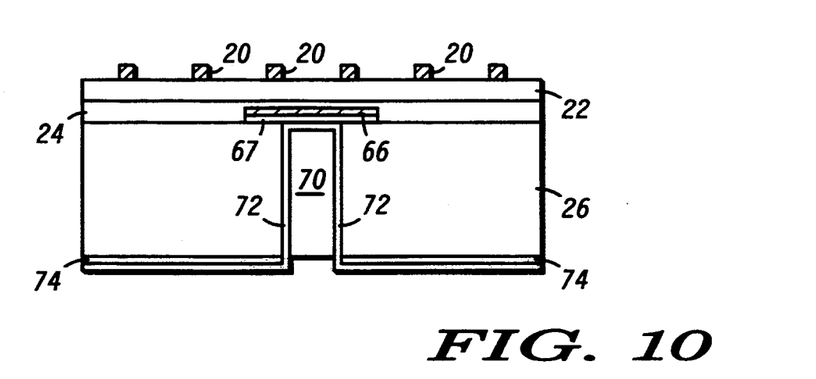

Turning to FIG. 10, dielectric layer 74 is patterned and opened to allow anisotropic etching of silicon substrate 26 to form region 70 that will become the through-substrate via. An isolation dielectric 72 is conformally deposited at relatively low temperatures to avoid altering properties of IC device layer 24 or interconnect layer 22. Plasma Enhanced (PE) CVD of oxide at around 400° C. is a good choice, as is PECVD of silicon nitride.

Figure 11:
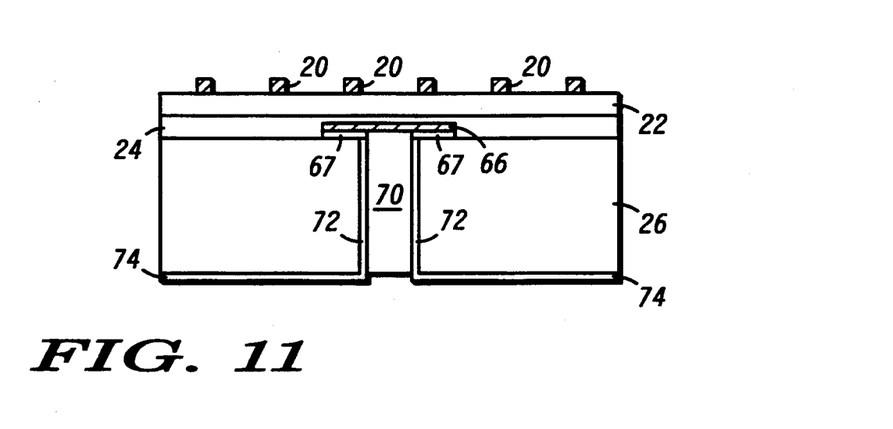

In FIG. 11, etching is continued until dielectric pad 67 is reached and then metal pad 66 is reached. Either dielectric pad 67 or metal pad 66 can serve as an etch stop for the silicon etch. Note that at the beginning of the process sequence of FIG. 10, substrate 26 could be thinned to minimize the etch required. An RIE etch using halogen based chemistry as described for FIG. 2 would be a desirable etch, and $SiO_2$ would be a good choice for pad dielectric 67, although other etches and materials can be chosen. An anisotropic etch is used to remove isolation layer 72 from the bottom surface of substrate 26. The anisotropic etch also removes dielectric pad 67 to expose metal pad 66 while leaving the walls of region 70 covered with isolation layer 72.

Figure 12:
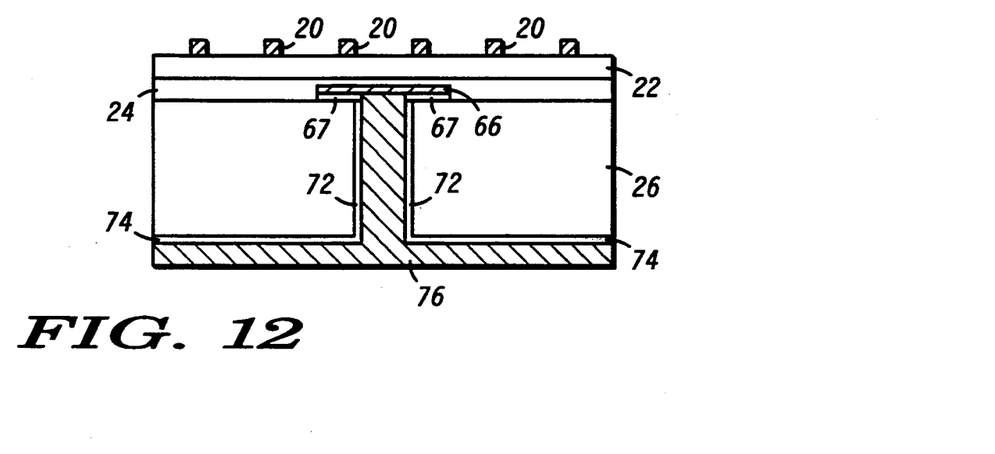

FIG. 12 illustrates a conducting material 76 deposited to fill region 70 and achieve electrical contact with metal pad 66. In contrast with the process employing FIG. 4, the material choices for conducting material 76 are different. In this case, low temperature compatible materials such as copper, aluminum and others may be considered since all high temperature processes have been completed. A preferred technique would be selective plating from metal pad 66. This would fill region 70 and minimize the possibility of voids. Selective plating of copper is a preferred material and technique, but optional materials include aluminum or tungsten LPCVD and others.

Figure 13:
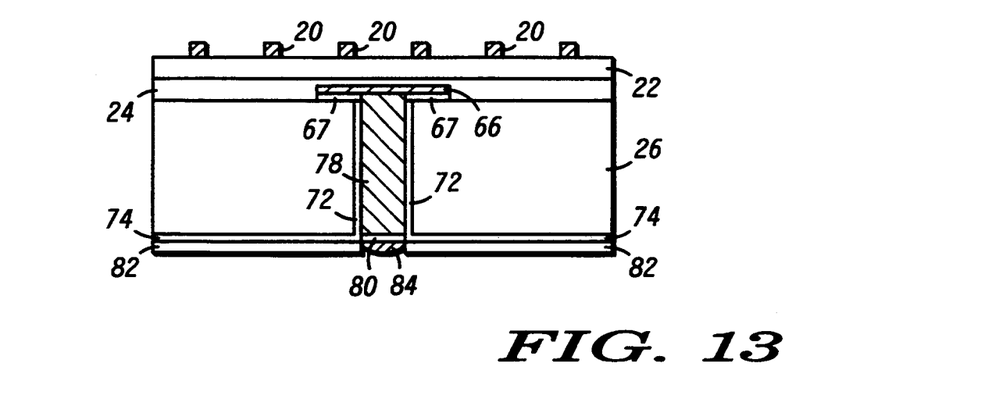
Figure 14:
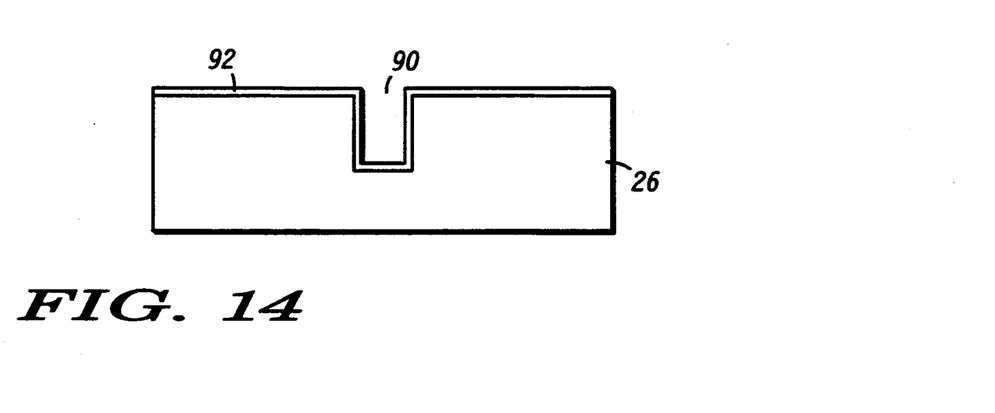
FIGS. 14-19 illustrate a third sequence of processing steps to form the through-substrate vias of FIG. 1.

In FIG. 13, a planarization step is used to remove excess conductive material 76, while leaving dielectric layer 74. Conventional processing is used to add and pattern dielectric layer 82 to provide access to through-substrate via 78, as described above in FIG. 7. A adhesion/barrier layer 80 and bump 84 are fabricated using techniques common in the industry also as described for FIG. 7.

Finally, the structure illustrated in FIG. 13 is combined with a second duplicate substrate 26 fabricated in the manner indicated by FIGS. 9-13. The combination of two substrates like 26 from FIG. 13 yields the two-sided chip 21 as shown in FIG. 8 and FIG. 1. The through-substrate via 70 electrically connects circuit nodes in IC device layer 24 and/or interconnect layer 22 with circuit nodes of IC device layer 32 and/or interconnect layer 34. Slight differences in element designations may be necessary due to possible differences in materials in FIGS. 7 and 13.

Figure 15:
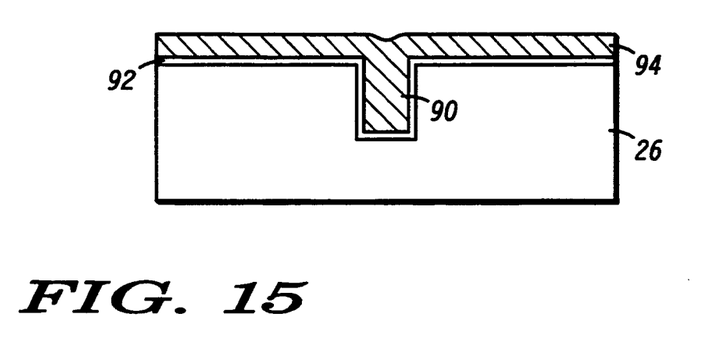
Figure 16:
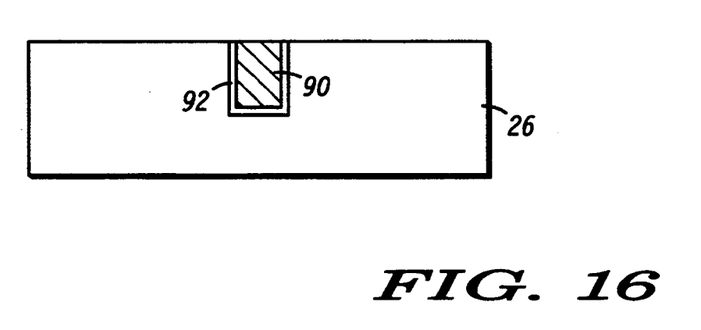
Figure 17:
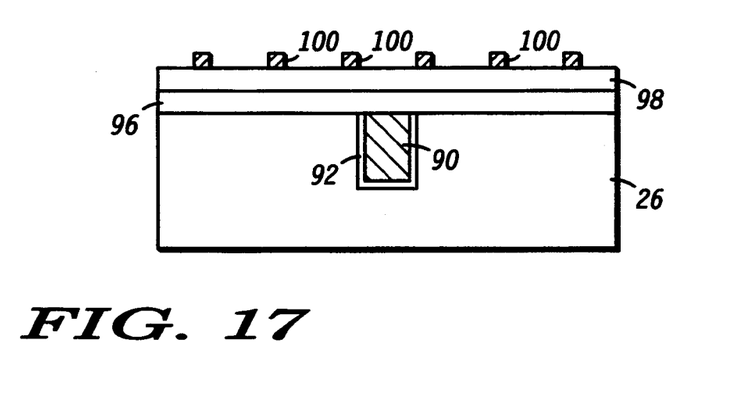

A third method to practice the present invention is a variation of the process described in FIGS. 2-8, as shown in FIGS. 14-19. In the third method, region 90 is formed partially through substrate 26 in FIG. 14 using RIE etching or other means as previously described. A dielectric layer 92 is formed by thermal oxidation or low pressure CVD. In FIG. 15, conductive material 94 is conformally deposited so as to fill region 90. In FIG. 16, chem-mechanical polishing is used to remove excess conductive material 94, and to provide a smooth flat surface for subsequent IC device processing. In FIG. 17, standard processing techniques are used to provide IC device layer 96, interconnect layer 98 and inter-substrate interconnects 100.

Figure 18:
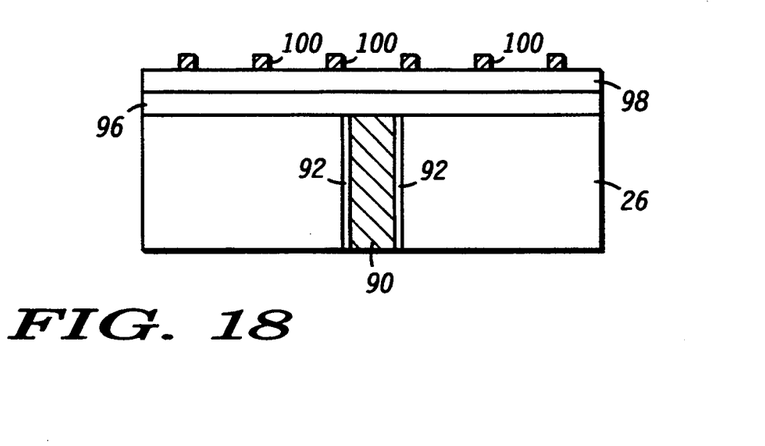
Figure 19:
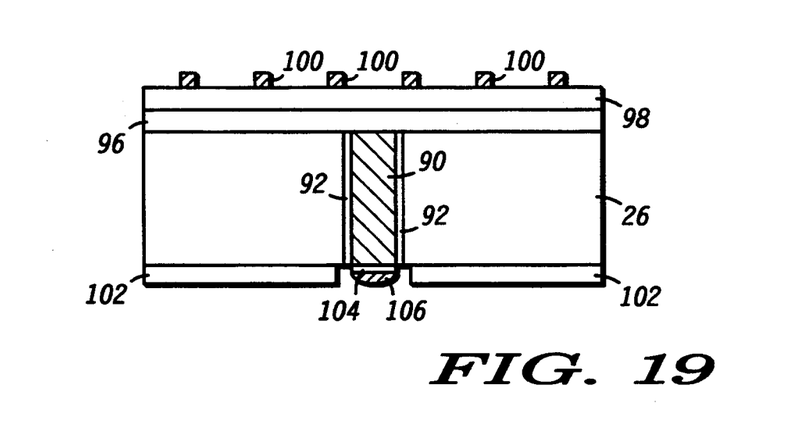

A wafer thinning process is used to remove the bottom surface until through-substrate via 90 is exposed as shown in FIG. 18. Conventional processing is used to add and pattern dielectric layer 102 to provide access to through-substrate via 90, as described above in FIG. 7. A adhesion/barrier layer 104 and bump 106 are formed using techniques as described for FIG. 7. Two substrates like 26 fabricated using the processes described in FIGS. 14–19 are joined together to yield the two-sided chip 21 shown in FIG. 8 and FIG. 1. The through-substrate via 90 electrically connects circuit nodes in IC device layers and/or interconnect layers between the two surfaces of composite substrate 26.

It should be clear that the system depicted in FIG. 1 could take on a variety of other forms besides that shown, and could, for example include additional two-sided chips such as 21 to allow higher stacking capabilities, or several single-sided chips could be mounted side-by-side on a larger single or two-sided composite chip. These and other variations would greatly increase the flexibility for system definition.

Thus, the present invention provides a stacked module assembly with through-substrate vias between opposite surfaces of a substrate to provide a minimal propagation path length for signals passing between the IC device layers. The minimal length reduces propagation delay and increase the operating speed of the overall assembly.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of forming through-substrate vias in a substrate, comprising the steps of:
    forming a first hollow region through a first substrate;
    depositing a first dielectric layer on a first surface of said first substrate and on inner surfaces of said first hollow region;
    depositing a first conductive layer through said first hollow region to form a first through-substrate via;
    removing said first conductive layer and said first dielectric layer from said first surface of said first substrate to leave said first through-substrate via isolated from said first substrate by said first dielectric layer;
    forming a first IC device layer on said first surface of said first substrate with circuit nodes electrically coupled to the through-substrate vias;
    forming a first interconnect layer on said first IC device layer;
    forming first inter-chip interconnects on said first interconnect layer;
    patterning a second dielectric layer on a second surface of said first substrate to provide access to said first through-substrate via; and
    forming a first bump making contact to said first through-substrate via.

2. The method of claim 1 further including the steps of:
    forming a second region through a second substrate;
    depositing a third dielectric layer on a first surface of said second substrate and on inner surfaces of said second region;
    depositing a second conductive layer through said second region;
    removing said second conductive layer and said third dielectric layer from said first surface of said second substrate to leave a second through-substrate via isolated from said second substrate by said third dielectric layer;
    forming a second IC device layer on said first surface of said second substrate with circuit nodes electrically coupled to the through-substrate vias;
    forming a second interconnect layer on said second IC device layer;
    forming second inter-chip interconnects on said second interconnect layer;
    patterning a fourth dielectric layer on a second surface of said second substrate to provide access to said second through-substrate via;
    forming a second bump making contact to said second through-substrate via; and
    joining said first and second bumps of said first and second substrates to provide electrical connectivity between said first and second IC device layers.

3. A method of forming through-substrate vias in a substrate, comprising the steps of:
    forming a first IC device layer on a first surface of a first substrate;
    forming a first dielectric layer within said first IC device layer;
    forming a first pad within said first IC device layer isolated from said first substrate by said first dielectric layer;
    depositing a second dielectric layer on a second surface of said first substrate;
    etching a first region through said first substrate;
    depositing a third dielectric layer on said second dielectric layer and on inner surfaces of said first region for isolation;
    selectively removing portions of said first, second and third dielectric layers to expose said first pad;
    depositing a first conductive layer through said first region and contacting said first pad to form a first through-substrate via; and
    selectively removing said first conductive layer from said second surface of said first substrate to provide electrical isolation for said first through-substrate via.

4. The method of claim 3 further including the steps of:
    depositing a fourth dielectric layer on said second dielectric layer; and
    forming a first bump making contact to said first through-substrate via.

5. The method of claim 4 further including the steps of:
    forming a second IC device layer on a first surface of a second substrate;
    forming a fifth dielectric layer within said second IC device layer;
    forming a second pad within said second IC device layer isolated from said second substrate by said fifth dielectric layer;
    depositing a sixth dielectric layer on a second surface of said second substrate;

etching a second region through said second substrate;

depositing a seventh dielectric layer on said sixth dielectric layer and on inner surfaces of said second region for isolation;

selectively removing portions of said fifth, sixth and seventh dielectric layers to expose said second pad;

depositing a second conductive layer through said second region and contacting said second pad to form a second through-substrate via;

selectively removing said second conductive layer from said second surface of said second substrate to provide electrical isolation for said second through-substrate via;

depositing an eighth dielectric layer on said sixth dielectric layer;

forming a second bump making contact to said second through-substrate via; and joining said first and second bumps of said first and second substrates to provide electrical connectivity between said first and second IC device layers.

* * * * *